(12) United States Patent
Tamura

(10) Patent No.: US 7,060,588 B2
(45) Date of Patent: Jun. 13, 2006

(54) SEMICONDUCTOR DEVICE USING SHALLOW TRENCH ISOLATION AND METHOD OF FABRICATING THE SAME

(75) Inventor: Kazuhiro Tamura, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/731,747

(22) Filed: Dec. 9, 2003

(65) Prior Publication Data

US 2004/0121553 A1 Jun. 24, 2004

Related U.S. Application Data

(62) Division of application No. 10/260,484, filed on Sep. 30, 2002.

(30) Foreign Application Priority Data

Oct. 9, 2001 (JP) .............................. 2001-312034

(51) Int. Cl.
H01L 21/76 (2006.01)

(52) U.S. Cl. ...................... 438/424; 438/435; 438/437; 438/981

(58) Field of Classification Search ................ 438/424, 438/435, 437, 724, 757, 981
See application file for complete search history.

(56) References Cited

U.S. PATENT DOCUMENTS

| 5,719,085 | A | * | 2/1998 | Moon et al. ................ 438/424 |
| 5,726,090 | A | * | 3/1998 | Jang et al. ................... 438/435 |
| 5,985,735 | A | * | 11/1999 | Moon et al. ................ 438/435 |
| 5,989,978 | A | * | 11/1999 | Peidous ....................... 438/436 |
| 6,008,109 | A | * | 12/1999 | Fulford et al. ............... 438/437 |
| 6,074,927 | A | * | 6/2000 | Kepler et al. ................ 438/400 |
| 6,093,618 | A | * | 7/2000 | Chen et al. .................. 438/400 |
| 6,121,064 | A | * | 9/2000 | Lasky et al. .................. 438/16 |
| 6,221,736 | B1 | * | 4/2001 | Gau ............................ 438/435 |
| 6,248,645 | B1 | * | 6/2001 | Matsuoka et al. ........... 438/424 |
| 6,251,735 | B1 | * | 6/2001 | Lou ............................ 438/296 |
| 6,277,706 | B1 | | 8/2001 | Ishikawa ..................... 438/424 |
| 6,331,469 | B1 | * | 12/2001 | Park et al. ................... 438/296 |
| 6,576,558 | B1 | * | 6/2003 | Lin et al. ..................... 438/700 |
| 6,627,514 | B1 | * | 9/2003 | Park et al. ................... 438/435 |
| 6,740,592 | B1 | * | 5/2004 | Doong ........................ 438/700 |
| 6,794,269 | B1 | * | 9/2004 | Gopalan et al. ............. 438/427 |
| 2002/0001917 | A1 | * | 1/2002 | Park ............................ 438/424 |
| 2002/0022340 | A1 | * | 2/2002 | Lin et al. ..................... 438/435 |
| 2003/0181022 | A1 | * | 9/2003 | Mehrad et al. .............. 438/437 |

FOREIGN PATENT DOCUMENTS

| JP | 61-239640 | | 10/1986 |
| JP | 06-163681 | | 6/1994 |
| JP | 11-003936 | | 1/1999 |
| JP | 11-214497 | | 8/1999 |
| JP | 2001144170 A | * | 5/2001 |
| KR | 2001008560 | * | 2/2001 |
| TW | 336344 | | 7/1998 |

* cited by examiner

Primary Examiner—Mary Wilczewski
Assistant Examiner—Toniae M. Thomas
(74) Attorney, Agent, or Firm—Hayes Soloway P.C.

(57) ABSTRACT

A semiconductor device adopting shallow trench isolation for reducing an internal stress of a semiconductor substrate. The semiconductor device is composed of a semiconductor substrate provided with a trench for isolation, and an insulating film formed to cover the trench for relaxing an internal stress of the semiconductor substrate. The insulating film includes a first portion disposed to be opposed to a bottom of the trench, and a second portion disposed to be opposed to a side of the trench. A first thickness of the first portion is different from a second thickness of the second portion.

7 Claims, 8 Drawing Sheets

SEMICONDUCTOR DEVICE USING SHALLOW TRENCH ISOLATION AND METHOD OF FABRICATING THE SAME

This Application is a divisional application of U.S. application Ser. No. 10/260,484, filed Sep. 30, 2002.

BACKGROUND OF THE INVENTION

1. Field of the Invention

The present invention relates to a semiconductor device and a method of fabricating the same. More particularly, the present invention relates to a semiconductor device using shallow trench isolation.

2. Description of the Related Art

Highly integrated semiconductor devices often adopt shallow trench isolation. Isolation has been conventionally achieved by a LOCOS (Local Oxidation of Silicon) technique. However, the LOCOS technique has difficulties in fabricating highly integrated semiconductor devices, such as bird's beaks and poor isolation abilities. This situation encourages the adoption of the shallow trench isolation.

Figure 1:
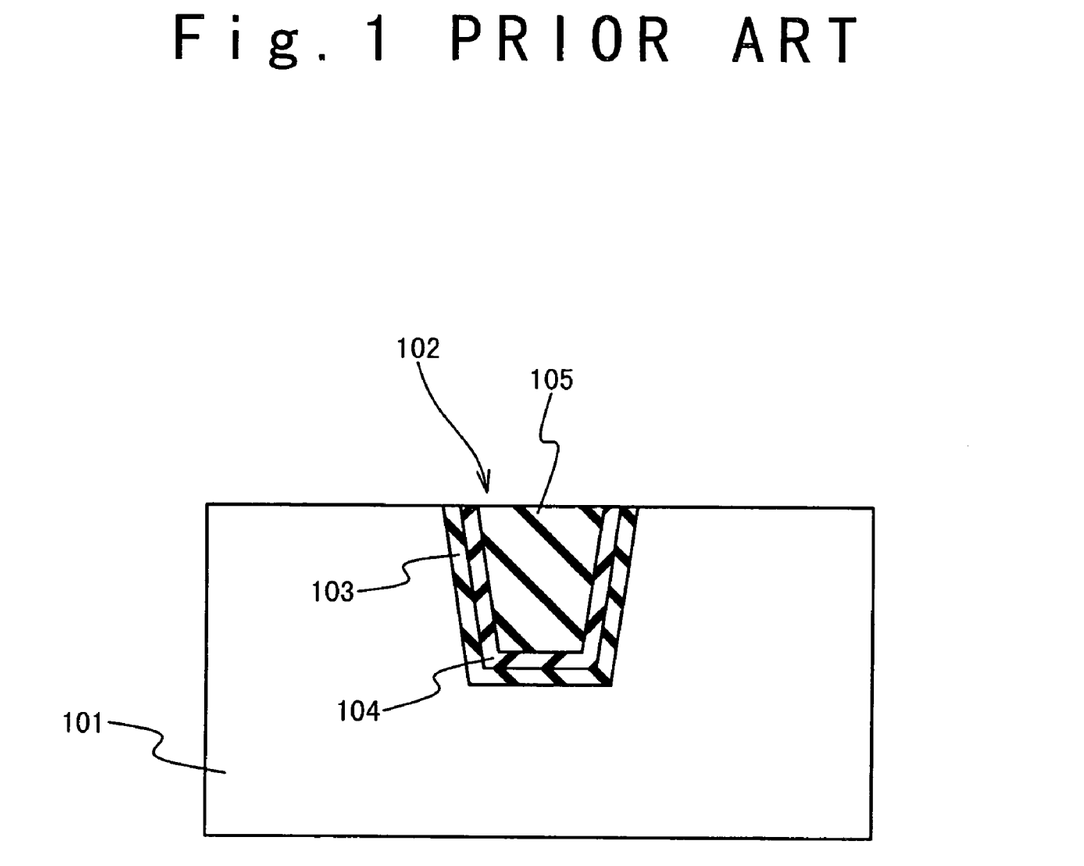
FIG. 1 shows a conventional semiconductor device adopting shallow trench isolation.

FIG. 1 shows a conventional structure of a semiconductor devices using shallow trench isolation. A trench 102 is formed on a silicon substrate 101. The inner surface of the trench 102 is coated by a silicon oxide film 103 formed by thermal oxidization. A liner 104 made of silicon nitride is formed on the silicon oxide film 103. A silicon oxide film 105 is formed on the liner 104 to fill the trench 102.

The liner 104 relaxes the interior stress induced in the silicon substrate 101. The shallow trench isolation causes the interior stress to be applied to the silicon substrate 161, because of the difference in thermal expansion coefficients between the silicon substrate 101 and the silicon oxide film 105. The stress applied to the silicon substrate 101 induces crystal defects in the silicon substrate, and thus increases junction leak currents. The increase in the junction leak currents causes improper operations of semiconductor devices. The relaxation of the internal stress by the liner 104 reduces the junction leak current and thus improves the reliability of the semiconductor device.

It is desired that the internal stress of the semiconductor substrate be further reduced. The reduction of the internal stress efficiently improves the reliability of the semiconductor device.

SUMMARY OF THE INVENTION

Therefore, an object of the present invention is to provide a technique for further reducing the internal stress applied to the semiconductor substrate of the semiconductor device in which the shallow trench isolation is employed.

In an aspect of the present invention, a semiconductor device includes a semiconductor substrate provided with a trench for isolation, and an insulating film formed to cover the trench for relaxing an internal stress of the semiconductor substrate. The insulating film includes a first portion opposed to a bottom of the trench, and a second portion opposed to a side of the trench. A first thickness of the first portion is different from a second thickness of the second portion.

The first thickness of the first portion may be thinner than the second thickness of the second portion.

When the semiconductor device further includes another insulating film in the trench and the other insulating film exerts a compressive stress on the semiconductor substrate, the insulating film preferably exerts a tensile stress on said semiconductor substrate.

The insulating film is preferably formed of one selected from a group consisting of silicon nitride and silicon oxynitride.

In another aspect of the present invention, a semiconductor device includes a semiconductor substrate provided with a trench for isolation, and an insulating film formed to cover the trench for relaxing an internal stress of the semiconductor substrate. The insulating film is opposed to a side of the trench and is not opposed to a bottom of the trench.

In still another aspect of the present invention, a semiconductor device includes a semiconductor substrate provided with a trench for isolation, a silicon oxide film formed to cover the trench, and an insulating film formed on the silicon oxide film. The insulating film exerts a tensile stress on the semiconductor substrate. The insulating film includes a first portion opposed to a bottom of the trench, and a second portion opposed to a side of the trench. A first thickness of the first portion is thinner than a second thickness of the second portion.

In still another aspect of the present invention, a semiconductor device includes a semiconductor substrate provided with a trench for isolation, a silicon oxide film formed to cover the trench, and an insulating film formed on the silicon oxide film. The insulating film exerts a tensile stress on the semiconductor substrate. The insulating film is opposed to a side of the trench and is not opposed to a bottom of the trench.

In still another aspect of the present invention, a semiconductor device includes a semiconductor substrate provided with a trench for isolation, a silicon oxide film formed to cover the trench, and an insulating film disposed on the silicon oxide film. The insulating film is formed of one selected from a group consisting of silicon nitride and silicon oxynitride. The insulating film includes a first portion opposed to a bottom of the trench, and a second portion opposed to a side of the trench. A first thickness of the first portion is thinner than a second thickness of the second portion.

In still another aspect of the present invention, a semiconductor device includes a semiconductor substrate provided with a trench for isolation, a silicon oxide film formed to cover the trench, and an insulating film disposed on the silicon oxide film. The insulating film is formed of one selected from a group consisting of silicon nitride and silicon oxynitride. The insulating film is opposed to a side of the trench and is not opposed to a bottom of the trench.

In still another aspect of the present invention, a method of fabricating a semiconductor device is composed of:

forming a trench for isolation in the semiconductor substrate;

forming an insulating film to cover the trench for relaxing an internal stress of the silicon substrate. The insulating film includes a first portion opposed to a bottom of the trench, and a second portion opposed to a side of the trench. The first thickness of the first portion is different from a second thickness of the second portion. The first thickness of the first portion may be thinner than the second thickness of the second portion.

In still another aspect of the present invention, a method for fabricating a semiconductor device is composed of:

forming a trench for isolation in a semiconductor substrate;

forming an insulating film to cover the trench for relaxing an internal stress of the silicon substrate, wherein the insulating film is opposed to a side of the trench and is not opposed to a bottom of the trench.

In still another aspect of the present invention, a method for fabricating a semiconductor device is composed of:

forming a trench for isolation in a semiconductor substrate;

forming an insulating film on the silicon oxide film, wherein the insulating film exerts a tensile stress on the silicon substrate. The insulating film includes a first portion opposed to a bottom of the trench, and a second portion opposed to a side of the trench. A first thickness of the first portion is thinner than a second thickness of the second portion.

In still another aspect of the present invention, a method for fabricating a semiconductor device is composed of:

forming a trench for isolation in a semiconductor substrate;

forming a silicon oxide film to cover the trench;

forming an insulating film on the silicon oxide film. The insulating film is opposed to a side of the trench and is not opposed to a bottom of the trench.

In still another aspect of the present invention, a method for fabricating a semiconductor device is composed of:

forming a trench for isolation in a semiconductor substrate;

forming a silicon oxide film to cover the trench; and forming an insulating film on the silicon oxide film. The insulating film is formed of one selected from a group consisting of silicon nitride and silicon oxynitride. The insulating film includes a first portion opposed to a bottom of the trench, and a second portion opposed to a side of the trench. A first thickness of the first portion is different from a second thickness of the second portion.

In still another aspect of the present invention, a method for fabricating a semiconductor device is composed of:

forming a trench for isolation in a semiconductor substrate;

forming a silicon oxide film to cover the trench; and forming an insulating film on the silicon oxide film. The insulating film is formed of one selected from a group consisting of silicon nitride and silicon oxinitride. The insulating film is opposed to a side of the trench and is not opposed to a bottom of the trench.

DESCRIPTION OF THE PREFERRED EMBODIMENTS

An embodiment of a semiconductor apparatus according to the present invention and a method of manufacturing the same will be described below with reference to the attached drawings.

Figure 2:
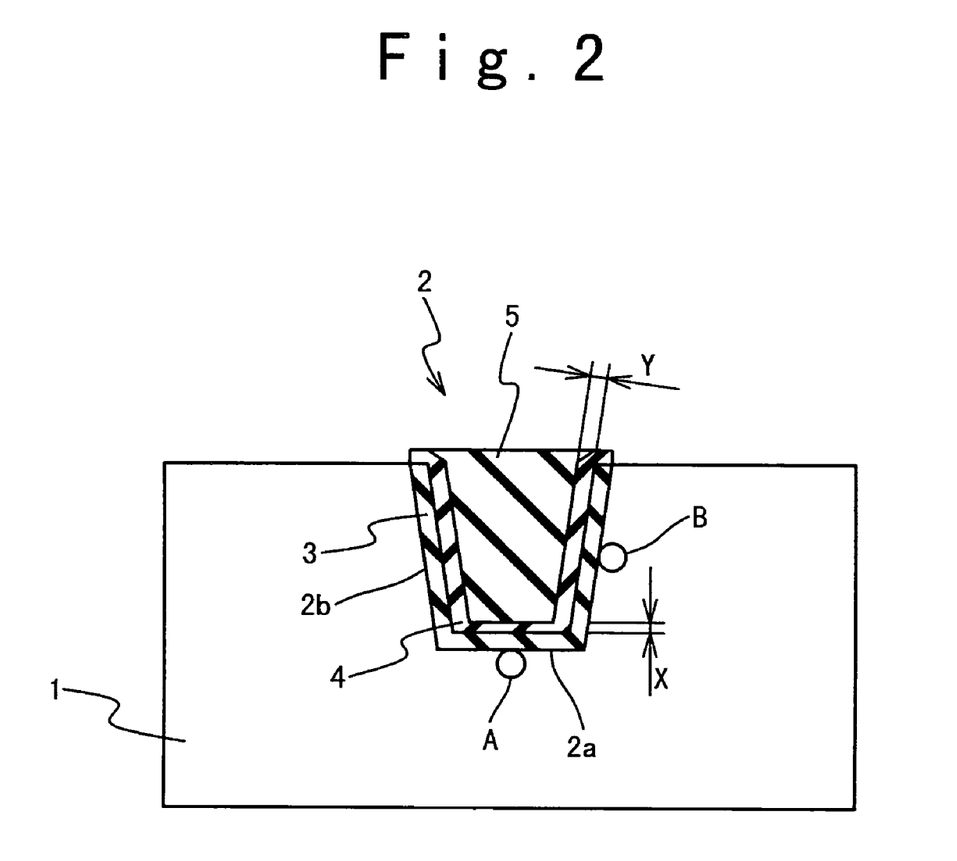
FIG. 2 shows a semiconductor device in an embodiment of the present invention.

In an embodiment of the semiconductor device according to the present invention, as shown in FIG. 2, a trench 2 is formed on a silicon substrate 1. An inner surface of the trench 2 is coated by a silicon oxide film 3. The silicon oxide film 3 is coated by a liner 4. A silicon oxide film 5 is formed on the liner 4. The trench 2 is filled with the silicon oxide film 3, the liner 4 and the silicon oxide film 5.

The liner 4 is formed of an insulating film that has a compressive internal stress. The silicon oxide films 3, 5 have the tensile internal stresses, and thus exerts compression stresses on the silicon substrate 1. The liner 4, which has a compressive internal stress, exerts a tensile stress on the silicon substrate 1, and thus relaxes the internal stress of the silicon substrate 1. The liner 4 is preferably formed of silicon nitride or silicon oxynitride.

The liner 4 includes a bottom portion that is opposed to the bottom surface 2a of the trench 2, and a side portion that is opposed to the side surface 2b of the trench 2. A film thickness X of the bottom portion of the liner 4 is thinner than a film thickness Y of the side portion of the liner 4. This structure further reduces the internal stress of the silicon substrate 1. The inventor has discovered that an internal stress of the silicon substrate 1 in the vicinity of the bottom 2a of the trench 2 is weaker than that in the vicinity of the side 2b of the trench 2. The difference in the film thicknesses of the bottom and side portions causes the different stresses on the vicinity of the bottom surface 2a and side surface 2b, and effectively reduces the internal stress of the silicon substrate 1.

Figure 3:
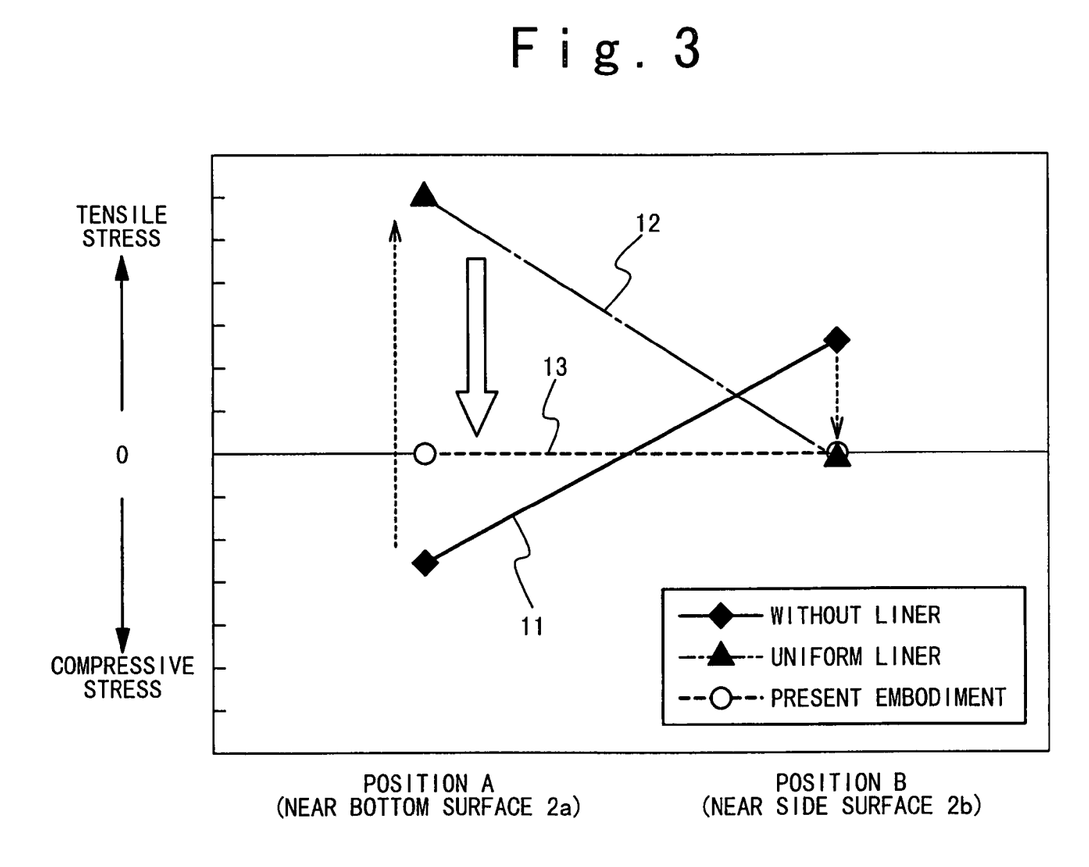
FIG. 3 shows internal stresses exerted on a silicon substrate.

FIG. 3 shows the internal stresses of the silicon substrate 1 at positions A and B indicated by the circles in FIG. 2. The position A is located near the bottom surface 2a of the trench 2, and the position B is located near the side of the trench 2. The internal stresses of the silicon substrate 1 are measured by a convergent beam electron diffraction (CBED) method.

Three samples have been fabricated; a first sample has a structure in which the liner 4 is excluded from the structure shown in FIG. 2, a second sample has a structure in which the liner 4 is conformal or uniform in thickness, and a third sample has the structure shown in FIG. 2. A line 11 in FIG. 3 represents the internal stresses of the silicon substrate without the liner 4. A line 12 represents the internal stresses of the silicon substrate 1 when the liner 4 is uniform in the film thickness. A line 13 represents the internal stresses of the silicon substrate 1 in the semiconductor device having the structure shown in FIG. 2.

In regard to the case that the film thickness of the liner 4 is uniform, the internal stress of the silicon substrate 1 is weak at the position B as indicated by the line 12. However, the considerably strong tensile stress is applied to the silicon substrate 1 at the position A, which is located near the bottom plane of the trench 2. This implies that the uniform liner 4 exerts the excessive tensile stress on the silicon substrate 1 at the position A.

The line 13 implies that the structure in which the film thickness X of the bottom portion of the liner 4 is thinner than the film thickness Y of the side portion remarkably reduces the internal stress of the silicon substrate 1 at the position A. The thinner film thickness of the bottom portion prevents an excessive tensile stress from being exerted on the silicon substrate 1.

Figure 4:
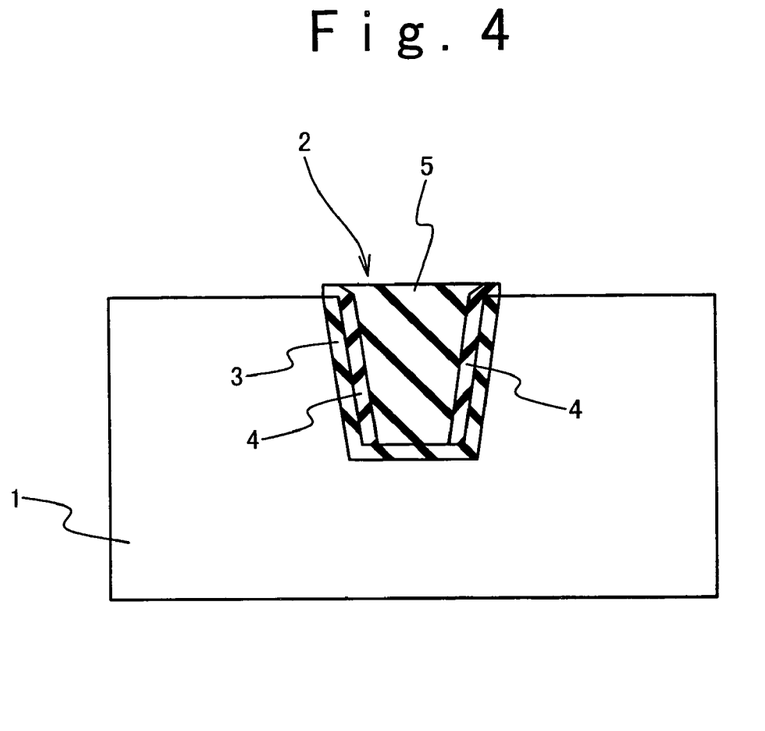
FIG. 4 shows a modification of the semiconductor device in the embodiment.

With reference to FIG. 2, the film thickness X of the bottom portion of the liner 4 is adjusted on the basis of the internal stress applied to the silicon substrate 1. It should be noted that the adjusted film thickness X of the bottom portion might be zero as shown in FIG. 4. That is, the liner 4 may be designed such that the liner 4 is not opposed to the bottom surface 2a of the trench 2.

The method of fabricating the semiconductor device shown in FIG. 2 will be described below.

Figure 5:
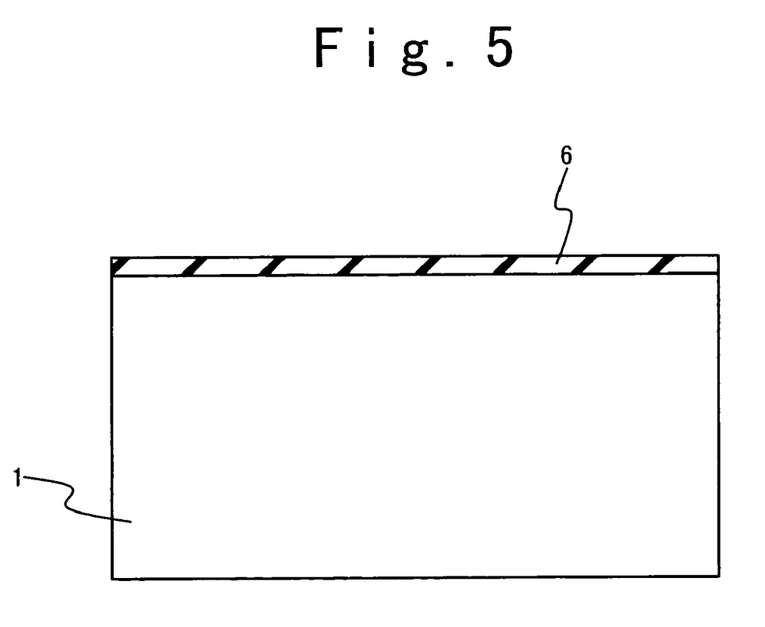
FIGS. 5 to 12 are section views showing a fabrication process of the semiconductor device in the embodiment.

As shown in FIG. 5, the surface of the silicon substrate 1 is thermally oxidized to thereby form a sacrificed oxide film 6. A film thickness of the sacrificed oxide film 6 is typically 10 to 20 nm.

Figure 6:
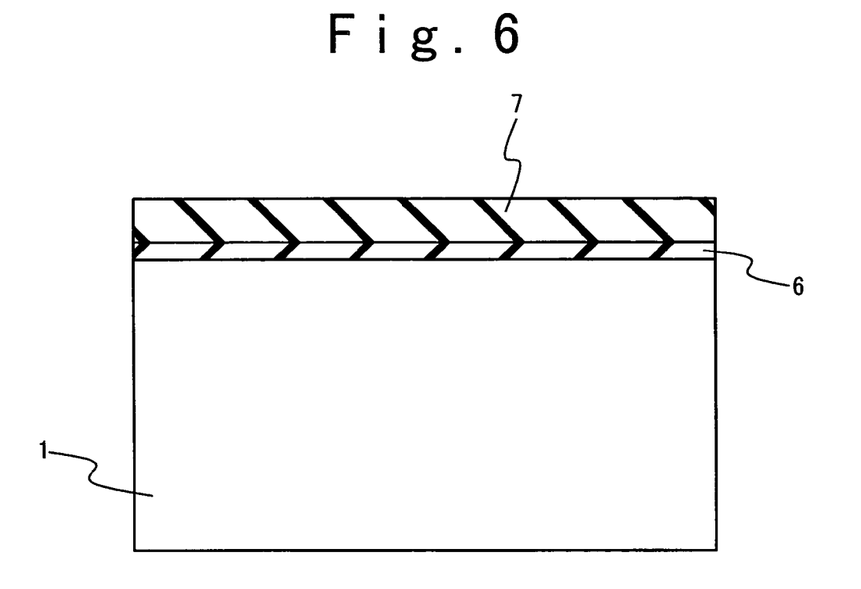

A silicon nitride film 7 is then formed on the sacrificed oxide film 6, as shown in FIG. 6. A film thickness of the silicon nitride film 7 is typically 100 to 200 nm.

Figure 7:
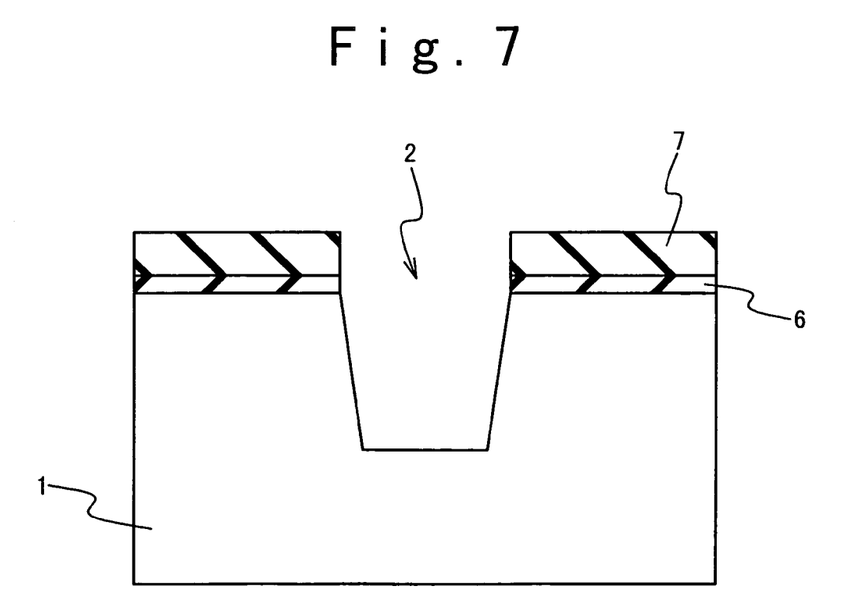

After the formation of the silicon nitride film 7, as shown in FIG. 7, the sacrificed oxide film 6 and the silicon nitride film 7 are patterned by an etching technique, which is well known in the art. The silicon substrate 1 is then etched to form the trench 2 by using the patterned sacrificed oxide film 6 and silicon nitride film 7 as a mask.

After the formation of the trench 2, the inner surface of the trench 2 is thermally oxidized to thereby form the silicon oxide film 3. A film thickness of the silicon oxide film 3 is typically 10 to 30 nm.

Figure 8:
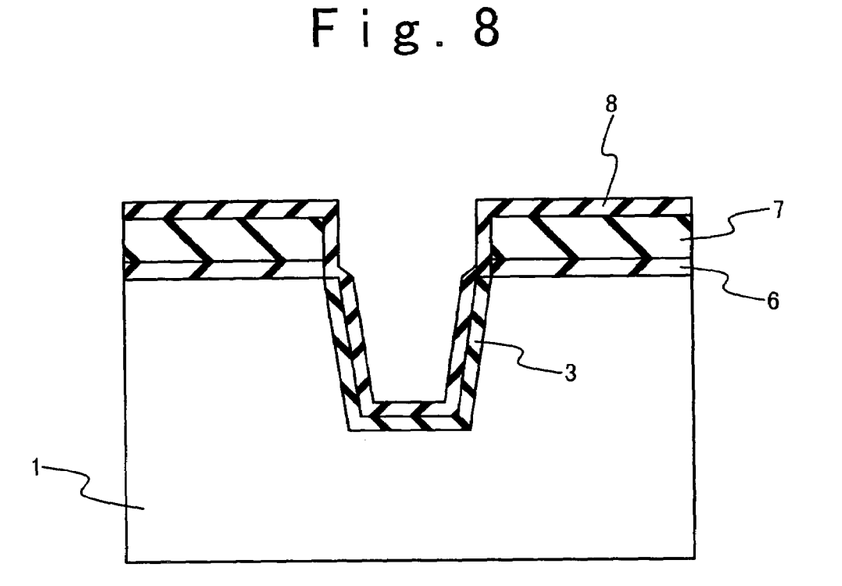

A silicon nitride film 8 is then formed to cover the entire structure as shown in FIG. 8. The silicon nitride film 8 is exemplarily formed by using an LPCVD (Low Pressure Chemical Vapor Deposition) method. A film thickness of the silicon nitride film 8 is substantially uniform, and is typically 3 to 10 nm. The silicon nitride film 8 is formed in the conditions that the formed silicon nitride film 8 has the compressive internal stress. The other insulation film having a compressive internal stress may be used instead of the silicon nitride film 8. For example, a silicon oxide nitride film may be formed instead of the silicon nitride film 8.

Figure 9:
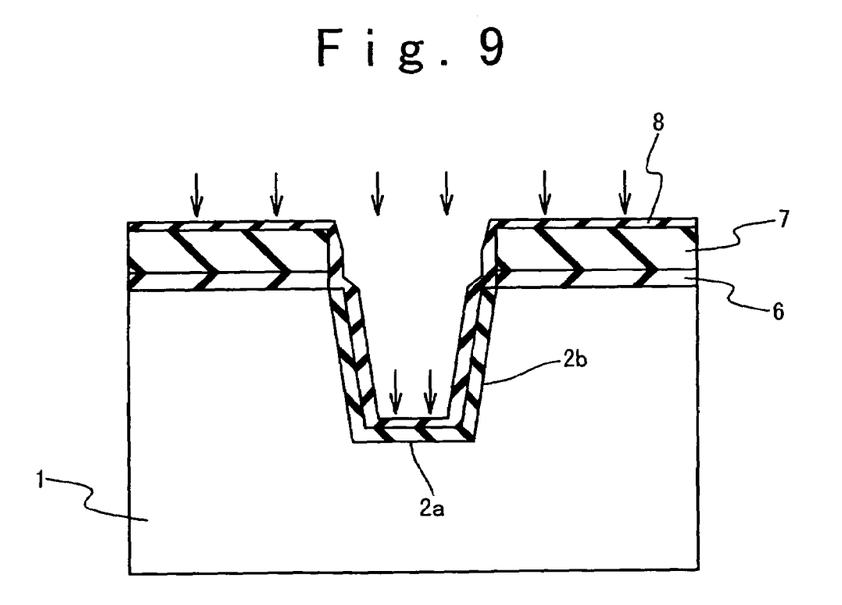

After the formation of the silicon nitride film 8, as shown in FIG. 9, the silicon nitride film 8 is anisotropically etched in the direction perpendicular to the major surface of the silicon substrate 1. A bottom portion of the silicon nitride film 8, which is opposed to the bottom surface 2a, is partially removed. This causes the film thickness of the bottom portion of the silicon nitride film 8 to be thinner than that of the side portion opposed to the side 2b of the trench 2. It should be noted that the bottom portion of the silicon nitride film 8 might be totally removed to form the structure shown in FIG. 4. The etching of the silicon nitride film 8 may be executed by the physical etching such as ion milling or the physical and chemical etching.

Figure 10:
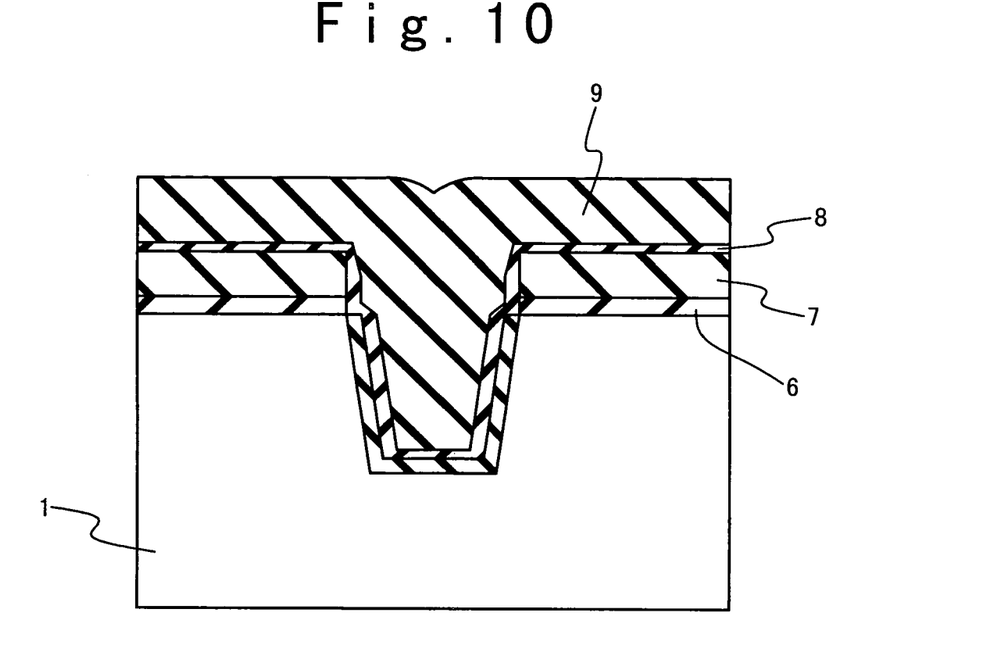

A silicon oxide film 9 is then formed to cover the entire structure by using a CVD method as shown in FIG. 10. The trench 2 is totally filled with the silicon oxide film 9.

Figure 11:
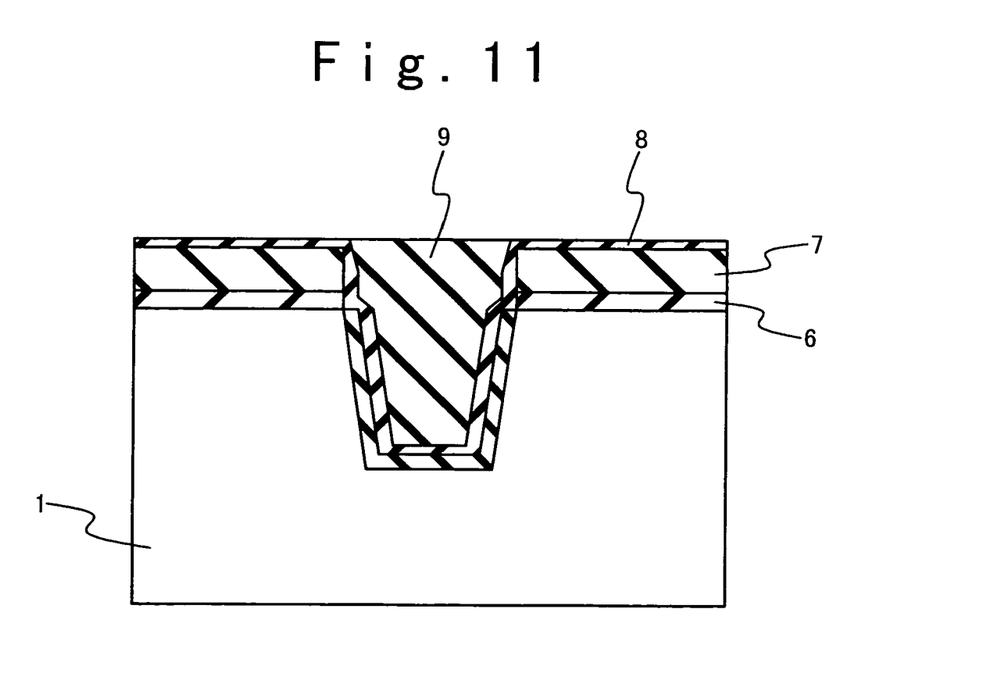

After the formation of the silicon oxide film 9, as shown in FIG. 11, a portion of the silicon oxide film 9 outside the trench 2 is removed to expose the surface of the silicon nitride film 8. The partial removal of the silicon oxide film 9 is achieved by a CMP (Chemical Mechanical Polishing) method. The silicon nitride film 8 and the silicon nitride film 7 function as stoppers during the CMP process.

Figure 12:
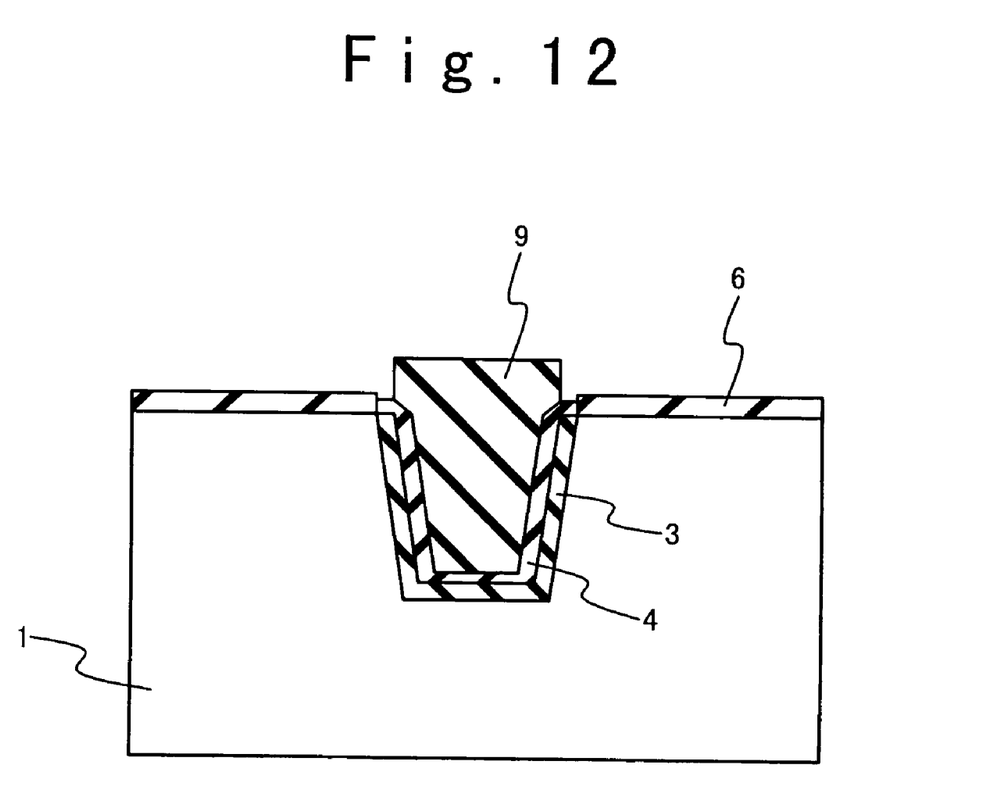

The silicon substrate 1 is then processed by heated phosphoric acid to remove the silicon nitride film 7 and a portion of the silicon nitride film 8 outside the trench 2 as shown in FIG. 12. The remaining portion of the silicon nitride film 8 constitutes the liner 4.

The silicon substrate 1 is then processed by hydrofluoric acid to remove the sacrificed oxide film 6 and a portion of the silicon oxide film 9 outside the trench 2. The removal of the sacrificed oxide film 6 and the portion of the silicon oxide film 9 completes the formation of the structure shown in FIG. 2 (or, FIG. 4). MOS transistors and other elements are then formed on the silicon substrate 1 to fabricate an LSI (Large Scale Integrated circuit).

As described, the semiconductor device in this embodiment has the structure in which the film thickness X of the bottom portion of the liner 4 is thinner than the film thickness Y of the side portion, or the film thickness X of the bottom portion is zero. This structure effectively reduces the internal stress of the silicon substrate 1.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method of fabricating a semiconductor device comprising:
   forming a trench for isolation in a semiconductor substrate; and
   forming an insulating film to cover said trench for relaxing an internal stress of said semiconductor substrate, wherein said insulating film comprises:
   a first portion disposed to be opposed to a bottom of said trench, and
   a second portion disposed to be opposed to a side of said trench, and
   wherein a first thickness of said first portion throughout is different from a second thickness of said second portion throughout, and wherein the second thickness of said second portion is substantially uniform along the entirety of said second portion.

2. The method according to claim 1, wherein said first thickness of said first portion is thinner than said second thickness of said second portion.

3. The method according to claim 2, further comprising:
   forming another insulating film in said trench, wherein said another insulating film exerts a compressive stress on said semiconductor substrate, and said insulating film exerts a tensile stress on said semiconductor substrate.

4. The method according to claim 2, wherein said insulating film is formed of one selected from a group consisting of silicon nitride and silicon oxynitride.

5. A method for fabricating a semiconductor device comprising:
   forming a trench for isolation in a semiconductor substrate;
   forming a silicon oxide film to cover said trench; and
   forming an insulating film on said silicon oxide film, wherein said insulating film exerts a tensile stress on said semiconductor substrate, and
   wherein said insulating film comprises:
   a first portion disposed to be opposed to a bottom of said trench, and
   a second portion disposed to be opposed to a side of said trench, and
   wherein a first thickness of said first portion throughout is thinner than a second thickness of said second portion throughout, and wherein the second thickness of said second portion is substantially uniform along the entirety of said second portion.

6. The method according to claim 5, wherein said insulating film is formed of one selected from a group consisting of silicon nitride and silicon oxynitride.

7. A method for fabricating a semiconductor device comprising:
   forming a trench for isolation in a semiconductor substrate;
   forming a silicon oxide film to cover said trench; and forming an insulating film on said silicon oxide film, wherein said insulating film is formed of one selected from a group consisting of silicon nitride and silicon oxinitride, wherein said insulating film comprises:
- a first portion disposed to be opposed to a bottom of said trench, and
- a second portion disposed to be opposed to a side of said trench, and wherein a first thickness of said first portion throughout is different from a second thickness of said second portion throughout, and wherein the second thickness of said second portion is substantially uniform along the entirety of said second portion.

* * * * *